United States Patent
Kan et al.

(10) Patent No.: US 11,869,616 B2
(45) Date of Patent: Jan. 9, 2024

(54) CENTRALLY LOGGING AND AGGREGATING MISCOMPARES ON CHIP DURING MEMORY TEST

(71) Applicant: Cypress Semiconductor Corporation, San Jose, CA (US)

(72) Inventors: Senwen Kan, Austin, TX (US); Andrew Payne, Austin, TX (US); Jeffrey W Gossett, Bothell, WA (US); Michael Joseph Pluhta, Seattle, WA (US); Richard A Rodell, Jr., Eagan, MN (US); Bjarni Benjaminsson, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 139 days.

(21) Appl. No.: 17/524,039

(22) Filed: Nov. 11, 2021

(65) Prior Publication Data
US 2023/0142759 A1    May 11, 2023

(51) Int. Cl.
*G11C 29/42* (2006.01)
*G11C 29/44* (2006.01)
*H03K 19/21* (2006.01)
*G11C 29/08* (2006.01)
*G11C 29/18* (2006.01)

(52) U.S. Cl.
CPC ............ *G11C 29/42* (2013.01); *G11C 29/18* (2013.01); *G11C 29/4401* (2013.01); *H03K 19/21* (2013.01); *G11C 2029/4402* (2013.01)

(58) Field of Classification Search
CPC ...... G11C 29/42; G11C 29/18; G11C 29/4401; G11C 2029/4402; H03K 19/21
See application file for complete search history.

(56) References Cited

U.S. PATENT DOCUMENTS

| | | | |
|---|---|---|---|
| 2003/0063517 A1* | 4/2003 | Jain | G11C 8/16 365/230.05 |
| 2004/0093540 A1* | 5/2004 | Adams | G11C 29/4401 714/733 |
| 2009/0303813 A1* | 12/2009 | Fekih-Romdhane | G11C 29/789 365/185.08 |
| 2009/0303814 A1* | 12/2009 | Fekih-Romdhane | G11C 29/76 365/200 |
| 2021/0074375 A1* | 3/2021 | Huott | G11C 29/12 |
| 2021/0375379 A1* | 12/2021 | Lim | G11C 29/4401 |

* cited by examiner

*Primary Examiner* — Thien Nguyen

(57) ABSTRACT

A system and method for centrally logging and aggregating miscompares on chip during a memory test. The method includes performing, by a built-in self-test (BIST) unit of a memory device, a memory test on one or more memory banks of the memory device using a first algorithm. The method includes generating miscompare results responsive to performing the memory test on the one or more memory banks of the memory device. The method includes determining failure diagnostic information based on the miscompare results. The method includes generating an error packet comprising the failure diagnostic information and the miscompare results. The method includes placing the error packet in a queue of a plurality of error packets to generate a queued error packet.

19 Claims, 4 Drawing Sheets

CENTRALLY LOGGING AND AGGREGATING MISCOMPARES ON CHIP DURING MEMORY TEST

TECHNICAL FIELD

The present disclosure relates generally to the field of memory devices, and more particularly, to systems and methods for centrally logging and aggregating miscompares on chip during a memory test.

BACKGROUND

Computing devices often rely on stored digital information which is mainly data that can be used to direct circuit performance. The digital information may be stored in different types of memory devices. Random Access Memory (RAM) is where the memory can be randomly accessed at any instant, without having to step through each memory location. RAM memory is volatile, which means that the information stored in the RAM will be lost once the power to it is removed. Conversely, Read Only Memory (ROM) is non-volatile in that its contents are not lost when power to it is removed. Memory devices are often tested for detects before being sold into the market.

BRIEF DESCRIPTION OF THE DRAWINGS

The present disclosure is illustrated by way of example, and not by way of limitation, in the figures of the accompanying drawings in which like reference numerals refer to similar elements and in which.

DETAILED DESCRIPTION

Figure 1:
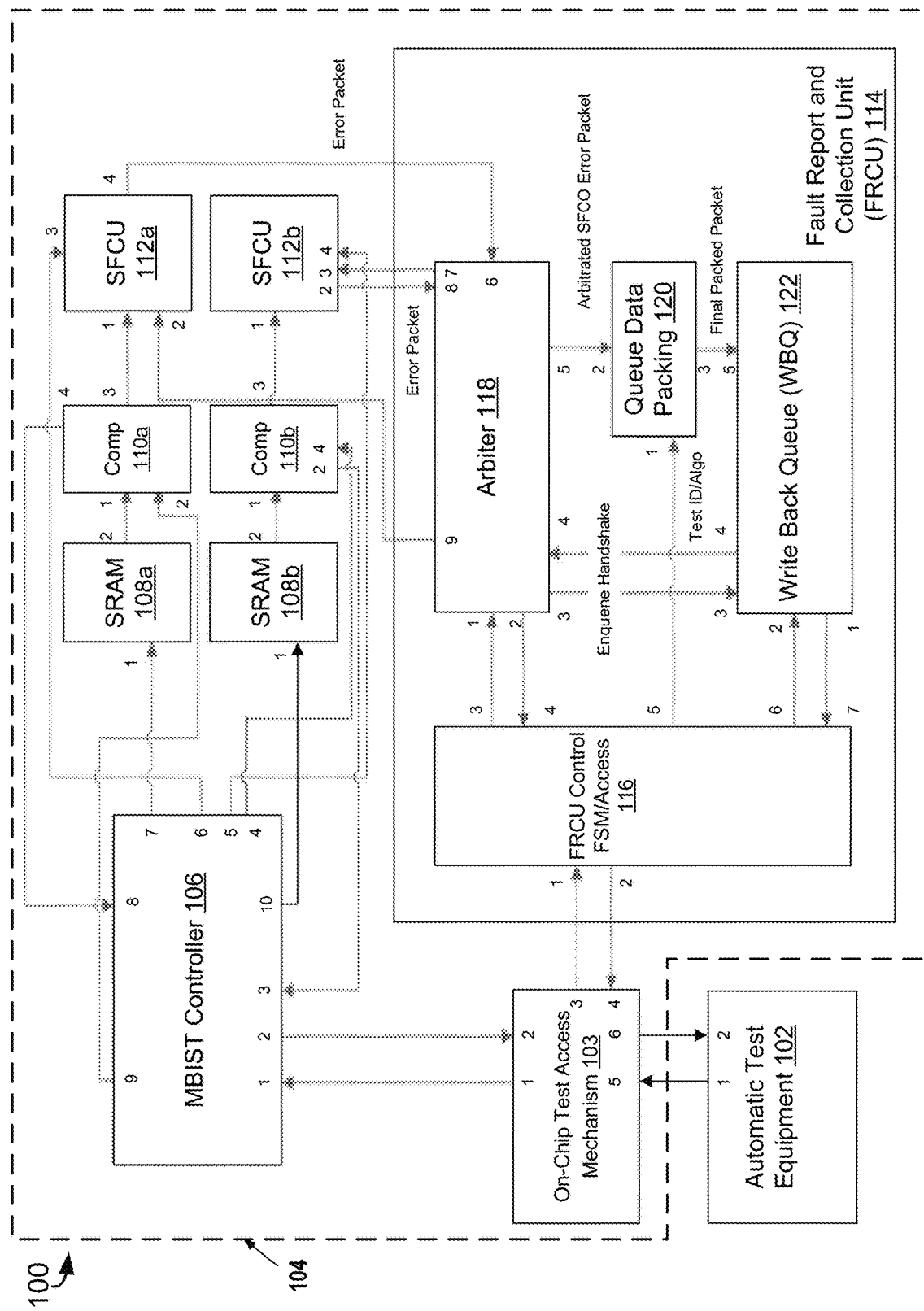
FIG. 1 is a block diagram illustrating an example environment for centrally logging and aggregating miscompares on chip during a memory test, according to some embodiments.

The following description sets forth numerous specific details such as examples of specific systems, components, methods, and so forth, in order to provide a good understanding of various embodiments of the techniques described herein for centrally logging and aggregating miscompares on chip during a memory test. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the scope of the present disclosure.

Developers of semiconductor chips, such as memory devices, may use an external automated test equipment (ATE) for high-volume testing of the semiconductor chips. The ATE may test a memory device by reading/writing data patterns to address locations of the memory device to confirm that the address locations are defect-free (e.g., no circuit defects, no semiconductor manufacturing defects, etc.). Since ATEs tend to be large and expensive, a memory device developer may prefer to test a memory device using one or more internal built-in self-test (BIST) engines, which are often faster than the ATE. In this instance, the ATE would simply provide a clock signal to the BIST engines of the memory device, which in turn, would cause the BIST engines to directly apply the data patterns to the memory locations and evaluate the memory outputs. Thus, the BIST engines of the memory device would handle the stimulus and observation features while occupying only a small portion of the real estate of the memory device.

While the conventional MBIST engines provide advantages over the ATE, they too have significant limitations that negatively impact a semiconductor developers' capability to efficiently and cost-effectively test memory devices. In particular, the conventional MBIST engines are incapable of logging the specific mechanism that caused the memory device to fail the memory testing performed by the MBIST engines. Without this capability, the conventional MBIST engines cannot log/report which MBIST engine failed, which algorithm failed, and/or which memory instance (e.g., bank, address, bit) failed. The conventional MBIST engines also fail to provide an interface that can be used to enable a repeated use of the same data pattern.

Semiconductor developer have tried to use third-party "specialized" testing equipment to determine the specific mechanism that caused the miscompare (e.g., difference between what is written to an address location versus what is read from the address location) and/or to perform memory testing using the same data pattern. These solutions, however, are not automated, but rather a manually intensive process that results in a higher tester time, which in turn, consumes yield analysis. For example, the specialized testing equipment must be setup and configured for each device/part—this is a lengthy, cumbersome process. Aside from being extremely expensive, the specialized testing equipment are also incapable of distinguishing simple and complex failures, so a single bit failure would require just as much testing effort as a multi-bit, complex failure.

Aspects of the disclosure address the above-noted and other deficiencies by providing an enhanced MBIST system and method for centrally logging and aggregating miscompares on chip during a memory test. As described in the below passages, in some embodiments, each read operation that is performed using the enhanced MBIST system may trigger a data comparison on an BIST Memory Collar or Wrapper, such as with an exclusive-OR (XOR) based logical evaluation (e.g., Compare_OUT). In some embodiments, a single-bit miscompare may be priority encoded into log 2 sized datum, where most of the comparator failures may be due to a single bit fail. In some embodiments, a single bit miscompare may be priority encoded with miscompare results in reverse order encode 2-bit errors.

In some embodiments, a memory device may include a single-fault error capture unit (SFCU) that is configured to encode the fault/failed bit position and memory address (each sometimes referred to as, "failure diagnostic information"). In some embodiments, over the iteration of the memory test, if the same error is detected, then a single address fault(s) may be encountered, but this condition can detect if more than one address is at fault—this detection can also be encoded by the SFCU.

In some embodiments, each SFCU may contain one or more register buffers that are configured to hold the encoded miscompare. In some embodiments, when more than one faulting address is detected, the latest faulting address would be captured along with an overflow bit set. In some embodiments, the latest faulting address and the overflow bit may be stored in the buffer.

In some embodiments, each SFCU may be configured to store a unique memory instance identifier (ID) (sometimes referred to as, "failure diagnostic information"), which is unique to a chip model and from all other memory instances (e.g., memory banks). In some embodiments, an SFCU can be created for every memory or selective subsets of yield impacting memories. In some embodiments, the output of each SFCU may be packetized for pipelining.

In some embodiments, the packetized output of each SFCU may then be centrally collected by an arbiter (e.g., Round Robin Arbiter) and dequeued in a functional unit called Fault and Report Collection Unit (FRCU). In some embodiments, the dequeuing may happen when the FRCU is instructed by an action vector on its input bundle to do so. In some embodiments, the dequeued packets from each SFCU may then be collected (e.g., gathered, aggregated) in a centralized Queue in FRCU. In some embodiments, when enqueuing SFCU packets, the FRCU may tag (e.g., label, assign) each packet with faulting algorithm information (e.g., the algorithm that was used to perform the memory test).

In some embodiments, the FRCU Finalized Error Queue may be accessed via the ATE or by an on-chip memory-mapped input-output (MMIO) access schemes. In some embodiments, the FRCU may be configured to provide queue overflow status information.

Therefore, when the enhanced MBIST system and method of the present disclosure are implemented, a semiconductor developer can mitigate and/or eliminate the manual work related to silicon diagnostics, which previously require labor intensive stop-on-nth error iterations for every failing chip that results in inefficient testing of the semiconductor devices. The enhanced MBIST system and method may allow a semiconductor developer to obtain failure diagnostic information during volume manufacturing at a low cost for every single chip. If there is a need to examine more complex failures, then the diagnostic information that is logged would provide the necessary information.

The enhanced MBIST system and method also allows memory test failure diagnostic data logging on-chip—as opposed to requiring an external ATE to log the failures associated with the memory. The diagnosis process may now occur during the design/development stage.

When implemented properly and consistently, a developer can reuse compatible JTAG compliant diagnostic patterns—e.g., a developer can start verifying the diagnostic pattern during system on chip (SoC) resistor-transistor logic (RTL) development. Because the tester access interface may remain the same, the same data patterns may be used from chip to chip. The developer may also acquire the majority of memory test failure information during volume manufacturing test, and field returns of the memory device by the customer due to memory issue may now be easier to diagnose than without these implementing these features. A customer may also now be able to access valuable diagnostic information regarding the performance of the chip.

FIG. 1 is a block diagram illustrating an example environment for centrally logging and aggregating miscompares on chip during a memory test, according to some embodiments. The environment 100 includes an automatic test equipment 102 (ATE) that is configured to perform tests on a device under test (DUT). The environment 100 includes a memory device 104, which is a DUT. Although FIG. 1 shows only one memory device 104, the ATE 102 may be configured to test many (e.g., 100's, 1000's, etc.) memory device 104 in series or in parallel.

The memory device 104 includes a static random-access memory (shown in FIG. 1 as, SRAM 108a) and an SRAM 108b. The memory device 104 includes an on-chip test access mechanism 103 that interfaces with the ATE 102. The memory device 104 includes an MBIST controller 106 that is configured to perform one or more tests (e.g., memory tests) on SRAM 108a and SRAM 108b, in series or in parallel. The MBIST controller 106 includes a comparator 110a (shown in FIG. 1 as, "comp 110a") and a comparator 110b (shown in FIG. 1 as, "comp 110b"). The memory device 104 includes a single fault error capture unit (SFCU) 112a and a SFCU 112b.

The memory device 104 includes a fault report and collection unit (FRCU) 114 that is configured to centrally log and/or aggregate (e.g., collect, obtain, gather) miscompares (e.g., error, failure) on the memory device 104 during the testing of the memory device 104. The FRCU 114 includes an FRCU control FSM/Access 116, an arbiter 118, a queue data packing 120, and a write back queue (WBQ) 122.

In some embodiments, the MBIST controller 106, the SFCUs (e.g., SFCU 112a, SFCU 112b), and the FRCU 114 may collectively be referred to as a BIST unit.

An output terminal 1 of the ATE 102 is coupled to an input terminal 5 of the on-chip test access mechanism 103. An input terminal 2 of the ATE 102 is coupled to output terminal 6 of the on-chip test access mechanism 103.

An output terminal 1 of the on-chip test access mechanism 103 is coupled to an input terminal 1 of the MBIST controller 106. An input terminal 2 of the on-chip test access mechanism 103 is coupled to output terminal 2 of the MBIST controller 106. An output terminal 9 of the MBIST controller 106 is coupled to an input terminal 2 of the comparator 110a.

An input terminal 8 of the MBIST controller 106 is coupled to an output terminal 4 of the comparator 110a. An output terminal 7 of the MBIST controller 106 is coupled to an input terminal 1 of the SRAM 108a, whose output terminal 2 is coupled to an input terminal 1 of comparator 110a, whose output terminal 3 is coupled to an input terminal 1 of the SFCU 112a.

An output terminal 6 of the MBIST controller 106 is coupled to an input terminal 3 of the SFCU 112a. An output terminal 5 of the MBIST controller 106 is coupled to an input terminal 4 of the SFCU 112b. An output terminal 10 of the MBIST controller 106 is coupled to an input terminal 1 of the SRAM 108b, whose output terminal 2 is coupled to an input terminal 1 of comparator 110b, whose output terminal 3 is coupled to an input terminal 1 of the SFCU 112b. The output terminal 4 of the MBIST controller 106 is coupled an input terminal 4 of the comparator 110b.

An output terminal 2 of the comparator 110b is coupled to an input terminal 3 of the MBIST controller 106.

An output terminal 2 of the SFCU 112b is coupled to an input terminal 8 of the arbiter 118. An output terminal 7 of the arbiter 118 is coupled to an input terminal 3 of the SFCU 112b. An output terminal 4 of the SFCU 112a is coupled to an input terminal 6 of the arbiter 118.

An output terminal 9 of the arbiter 118 is coupled to an input terminal 2 of the SFCU 112a. An input terminal 1 of the arbiter 118 is coupled to an output terminal 3 of the FRCU Control FSM/Access 116. An output terminal 2 of the arbiter 118 is coupled to an input terminal 4 of the FRCU Control FSM/Access 116.

An output terminal 3 of the on-chip test access mechanism 103 is coupled to an input terminal 1 of the FRCU Control FSM/Access 116. An input terminal 4 of the on-chip test access mechanism 103 is coupled to an output terminal 2 of the FRCU Control FSM/Access 116.

An output terminal 3 of the arbiter 118 is coupled to an input terminal 3 of the WBQ 122. An input terminal 4 of the arbiter 118 is coupled to an output terminal 4 of the WBQ 122. An input terminal 2 of the WBQ 122 is coupled to an output terminal 6 of the FRCU Control FSM/Access 116. An output terminal 1 of the WBQ 122 is coupled to an input terminal 7 of the FRCU Control FSM/Access 116.

An output terminal 5 of the arbiter 118 is coupled to an input terminal 2 of the queue data packing 120. An input terminal 1 of the queue data packing 120 is coupled to an output terminal 5 of the FRCU Control FSM/Access 116. An output terminal 3 of the queue data packing 120 is coupled to an input terminal 5 of the WBQ 122.

Figure 2:
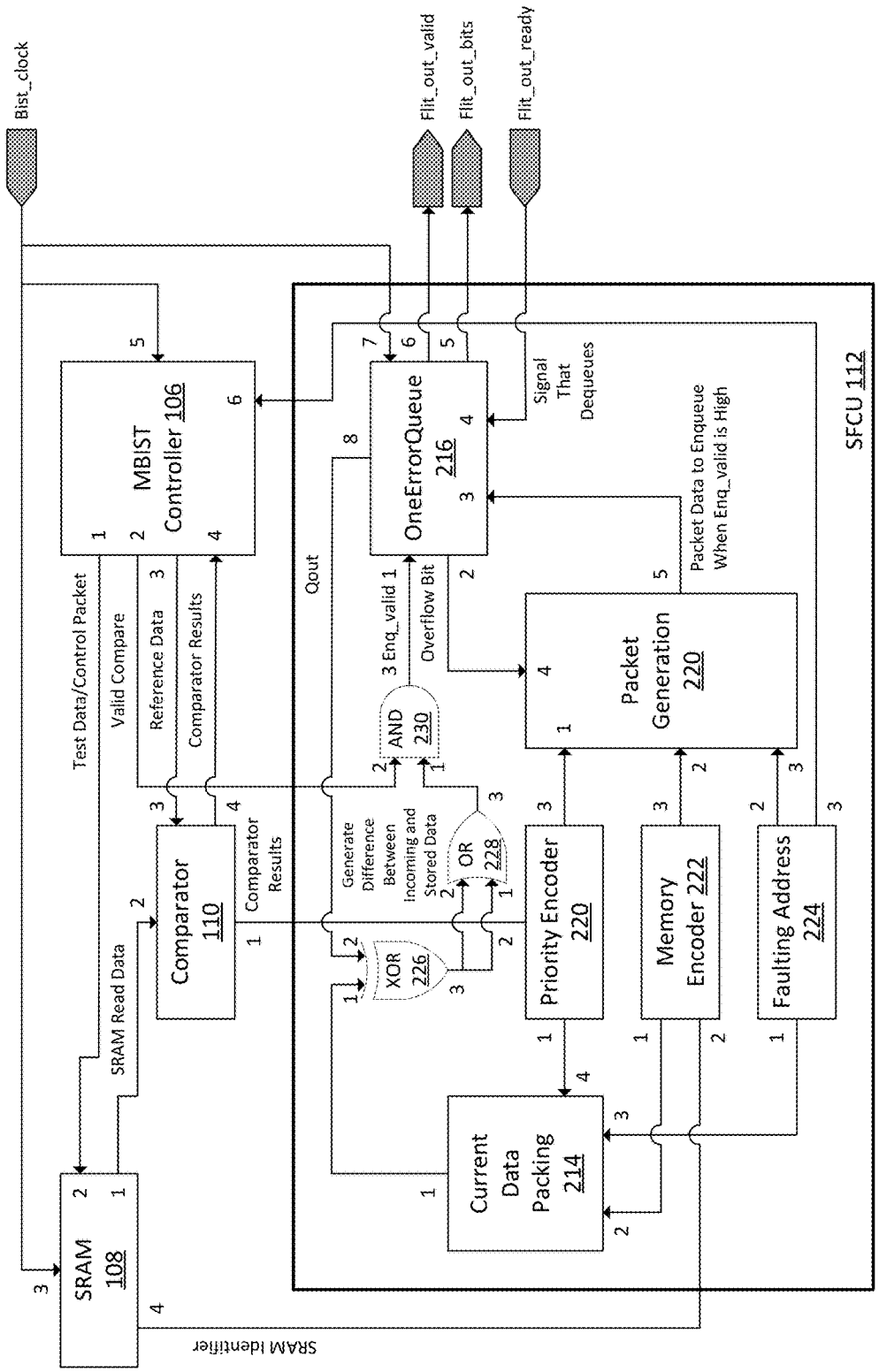
FIG. 2 is a block diagram illustrating an example environment for using an SFCU to encode a fault bit position and address, according to some embodiments.

FIG. 2 is a block diagram illustrating an example environment for using an SFCU to encode a fault bit position and address, according to some embodiments. The environment 200 includes an SRAM 108 (e.g., SRAM 108a or 108b in FIG. 1). The environment 200 includes a comparator 110 (e.g., comparator 110a or comparator 110b in FIG. 1). The environment 200 includes an MBIST controller 106. The environment 200 includes an SFCU 112 (e.g., SFCU 112a or SFCU 112b in FIG. 1).

The SFCU 112 includes a current data packing 214, a priority encoder 220, a faulting address 224, a packet generation 218, a OneErrorQueue 216, an XOR gate 226, an OR gate 228, and AND gate 230.

An output terminal 1 of the SRAM 108 is coupled to an input terminal 2 of the comparator 110. An input terminal 2 of the SRAM 108 is coupled to an output terminal 1 of the MBIST controller 106. A signal (shown in FIG. 2 as, "Bist_clock") is coupled to an input terminal 3 of the SRAM 108, an input terminal 5 of the MBIST controller 106, and an input terminal 7 of the OneErrorQueue 216.

An output terminal 1 of the comparator 110 is coupled to an input terminal 2 of the priority encoder 220. An output terminal 4 of the comparator 110 is coupled to an input terminal 4 of the MBIST controller 106. An output terminal 3 of the MBIST controller 106 is coupled to an input terminal 3 of the comparator 110.

An output terminal 2 of the MBIST controller 106 is coupled to an input terminal 2 of the AND gate 230, whose output terminal 3 is coupled to an input terminal 1 of the OneErrorQueue 216. An output terminal 6 of the MBIST controller 106 is coupled to an input terminal 3 of the faulting address 224.

An output terminal 4 of the SRAM 108 is coupled to an input terminal 2 of the memory encoder 222, whose output terminal 3 is coupled to an input terminal 2 of the packet generation 218, whose output terminal 5 is coupled to an input terminal 3 of the OneErrorQueue 216. An output terminal 1 of the memory encoder 222 is coupled to an input terminal 2 of the current data packing 214, whose output terminal 1 is coupled to an input terminal 1 of the XOR gate 226, whose output terminal 3 is coupled to input terminals 1, 2 of the OR gate. The output terminal of the OR gate 228 is coupled to an input terminal 1 of the AND gate 230.

An output terminal 2 of the OneErrorQueue 216 is coupled to an input terminal 4 of the packet generation 218. An input terminal 1 of the packet generation 218 is coupled to an output terminal 3 of the priority encoder 220. An output terminal 1 of the priority encoder 220 is coupled to an input terminal 4 of the current data packing 214. An input terminal 3 of the packet generation 218 is coupled to an output terminal 2 of the faulting address 224, whose output terminal 1 is coupled to an input terminal 3 of the current data packing 214.

An output terminal 8 of the OneErrorQueue 216 is coupled to an input terminal 2 of the XOR gate 226. A signal (shown in FIG. 2 as, "Flit_out_ready") is coupled to an input terminal 4 of the OneErrorQueue 216. An output terminal 5 of the OneErrorQueue 216 corresponds to a signal (shown in FIG. 2 as, "Flit_out_bits"). An output terminal 6 of the OneErrorQueue 216 corresponds to a signal (shown in FIG. 2 as, "Flit_out_valid").

Referring to FIG. 1, the ATE 102 may be configured to program the FRCU Control FSM/Access 116 to be operational by sending a message to the FRCU Control FSM/Access 116, where the message includes a programming sequence and/or a March Test Algorithm. In some embodiments, a March Test Algorithm may be a memory test program that includes a sequence of March Elements. In some embodiments, a March Element may be a limited sequence of SRAM operations applied to one or more (e.g., some, every) memory word prior to the next word. In some embodiments, the message causes the FRCU Control FSM/Access 116 to store the programming sequence and/or a March Test Algorithm code. In some embodiments, the ATE 102 is configured to program the MBIST controller 106 to be operational by sending a message to the MBIST controller 106. In some embodiments, the message causes the MBIST controller 106 to apply a March Test Algorithm from a set (e.g., one or more) of algorithms that are built (e.g., stored) into the MBIST controller 106 to SRAM 108a and/or SRAM 108b.

In some embodiments, the MBIST controller 106 may be configured to perform (e.g., launch, run, execute) a memory test on SRAM 108a and/or SRAM 108b, such as a selected March Test Algorithm. In some embodiments, a March Test Algorithm may be a Bit line inbalance fault (BLIF) test algorithm.

In some embodiments, the MBIST controller 106 may be configured to apply BLIF testing on the SRAM 108a and/or SRAM 108b.

In some embodiments, the MBIST controller 106 may be configured to compare, during the execution of the March Test Algorithm, its own reference or expected data with the read contents from an SRAM 108 (e.g., SRAM 108a, SRAM 108b) that is under test.

In some embodiments, the comparator 110a is configured to read information from one or more address locations of the SRAM 108a. In some embodiments, the comparator 110b is configured to read information from one or more address locations of the SRAM 108b.

In some embodiments, the comparator 110a is configured to determine (e.g., detect) whether the information on the inputs of the comparator 110a match or mismatch, where the information on the inputs of the comparator 110a corresponds to the information read from the one or more address locations of the SRAM 108a and the information (sometimes referred to as, "reference data") provided from the MBIST controller 106. In some embodiments, the comparator 110a is configured to generate, responsive to the determination, an output message that includes information indicating whether the inputs of the comparator 110a match or mismatch. In some embodiments, if the inputs of the comparator 110a are mismatched, then the output message may include the miscompare results. In some embodiments, the comparator 110a is configured to send the output message to the SFCU 112a. In some embodiments, the comparator 110a may be configured to generate and/or send the output message to the SFCU 112a only when comparator 110a determines that the inputs of the comparator 110a are mismatched.

In some embodiments, the comparator 110b is configured to determine (e.g., detect) whether the information on the inputs of the comparator 110b match or mismatch, where the information on the inputs of the comparator 110b corresponds to the information read from the one or more address locations of the SRAM 108b and the information (sometimes referred to as, "reference data") provided from the MBIST controller 106. In some embodiments, the comparator 110b is configured to generate, responsive to the determination, an output message that includes information indicating whether the inputs of the comparator 110b match or mismatch. In some embodiments, if the inputs of the comparator 110b are mismatched, then the output message may include the miscompare results (e.g., incorrect data, erred data). In some embodiments, the comparator 110b is configured to send the output message to the SFCU 112b. In some embodiments, the comparator 110b may be configured to generate and/or send the output message to the SFCU 112b only (e.g., not when there is a match) when comparator 110b determines that the inputs of the comparator 110b are mismatched.

In some embodiments, the SFCU 112a may be configured to receive the output message from the comparator 110a. In some embodiments, the SFCU 112a may be configured to detect faults (e.g., miscompares) in SRAM 108a based on the output message.

In some embodiments, the SFCU 112b may be configured to receive the output message from the comparator 110b. In some embodiments, the SFCU 112b may be configured to detect faults in SRAM 108b based on the output message.

Referring to FIG. 2, when the output message (sometimes referred to as, "Valid Compare") from the comparator 110 indicates a miscompare (e.g., meaning the comparison is not spurious and indicates the presence of fault in SRAM 108), the MBIST controller 106 may be configured to assert a "Valid Compare" signal high.

In some embodiments, the comparator 110 (e.g., comparator 110a, comparator 110b) may be configured to perform a comparison of the information (e.g., the "reference data" received from the MBIST controller 106 and the data that the comparator reads/receives from the SRAM 108) on its inputs using an XOR operation. For example, if the reference data is '11111111' and the SRAM 108 data is '11101111', then the miscompare results that the comparator 110 generates and sends to its respective SFCU 112 would be '00010000'. Given that most (e.g., or all) of the miscompares will be a vector consisting of a single '1' out of a plurality of '0s' (sometimes referred to as, "a 1-hot vector"), the SFCU 112 may be configured to compress this information with the failed bit position of the miscompare bit. Hence, the comparator 110 may be configured to send the miscompare results (shown in FIG. 2 as, "comparator results") to the priority encoder 220.

The priority encoder 220 may be configured to receive the comparator results data from the comparator 110. The priority encoder 220 may be configured to encode the failed bit position (sometimes referred to as, "1-hot position") of the '1' in the comparator results. In some embodiments, the priority encoder 220 may be configured to send a message to the current data packing 214, where the message includes the encoded failed bit position.

In some embodiments, the chip-wide unique Memory ID (shown in FIG. 2 as, "SRAM identifier") that is associated with the faulting memory (e.g., SRAM 108a, SRAM 108b) is now enabled for sampling. In some embodiments, the SRAM 108 sends the SRAM identifier to the memory encoder 22, which encodes the SRAM identifier, and sends the encoded SRAM identifier (e.g., identifying which SRAM 108 is failing) to the current data packing 214.

In some embodiments, MBIST controller 106 sends a message to the faulting address 224, where the message includes information indicating the memory address of the SRAM 108 that are associated with the miscompare. In some embodiments, the faulting address 224 sends a message to the current data packing 214, where the message includes information indicating the memory address of the SRAM 108 that is associated with the miscompare.

In some embodiments, the current data packing 214 may be configured to pack the encoded failed bit position, the encoded SRAM identifier, and the memory address to match the corresponding fields from the output of the OneErrorQueue 216, which are XOR'ed using XOR gate 226 with a portion of the outputs of the OneErrorQueue 216. The purpose of this XORing is to generate a difference between the already captured data if any with incoming miscompare to be captured. The XOR'ed outputs are then OR'ed with OR gate 228. In some embodiments, when the OR gate 228 is set high, it means the current miscompare is different from what's in the OneErrorQueue 216

In some embodiments, the OR'ed output from the OR gate 228 may be AND'ed by the AND gate 230 with the Valid compare from the comparator 110 to generate an "Enq_valid_signal," which is sent to the OneErrorQueue 216.

In some embodiments, the packet generation 218 may be configured to pack the encoded failed bit position (e.g., "Fault Bit Position"), the encoded SRAM identifier (e.g., Memory ID), the memory address (e.g., Faulting Address), and the OverFlow Bit (e.g., the OverFlow Bit may be set when there is one item in the OneErrorQueue 216) into packet data. In some embodiments, the packet data may be in the format of {(OverFlow Bit),(Memory ID),(Faulting Address),(Faulting Bit position)}.

In some embodiments, when the Enq_valid signal is asserted, then the packet data in the format of {(OverFlow Bit),(Memory ID),(Faulting Address),(Faulting Bit position)} gets registered or pushed into OneErrorQueue 216. For example, as shown in FIG. 1, the 3 outputs of the OneErrorQueue 216 are connected to the arbiter 118. In some embodiments, when a miscompare is stored in OneErrorQueue 216, the Flit_out_valid signal is then set high, which indicates to the arbiter 118 that it is ready to be dequeued. In some embodiments, when the arbiter 118 asserts Flit_out_ready while OneErrorQueue 216 asserts Flit_out_valid, the OneErrorQueue 216 is dequeued where the Flit_out_bits are captured by the arbiter 118.

Referring to FIG. 1, in some embodiments, when the ATE 102 samples the execution completion of exactly one march test algorithm, it transitions the FRCU 114 into a "Dequeueing" state. In some embodiments, the FRCU Control FSM/Access may cause the arbiter 118 to dequeue, which in turn may dequeue from the OneErrorQueue 216 as well.

In some embodiments, the dequeued data from the arbiter 118 may now be tagged with the algorithm identifier (ID) via the queue data packing 120, where the packed output may be in the format of {{Algorithm ID},(OverFlow Bit),(Memory ID),(Faulting Address),(Faulting Bit position)}.

In some embodiments, the outputs of queue data packing 120 may be pushed into the WBQ 122 until all entries in the OneErrorQueue 216 are dequeued via the arbiter 118.

In some embodiments, the ATE 102 then waits for the FRCU 114 to complete dequeueing into the WBQ 122. In some embodiments, the ATE 102 then captures entries in the WBQ 122 one entry at a time. In some embodiments, the ATE 102 may be configured to repeat one or more of the aforementioned operations using a next algorithm from a plurality of algorithms.

Figure 3:
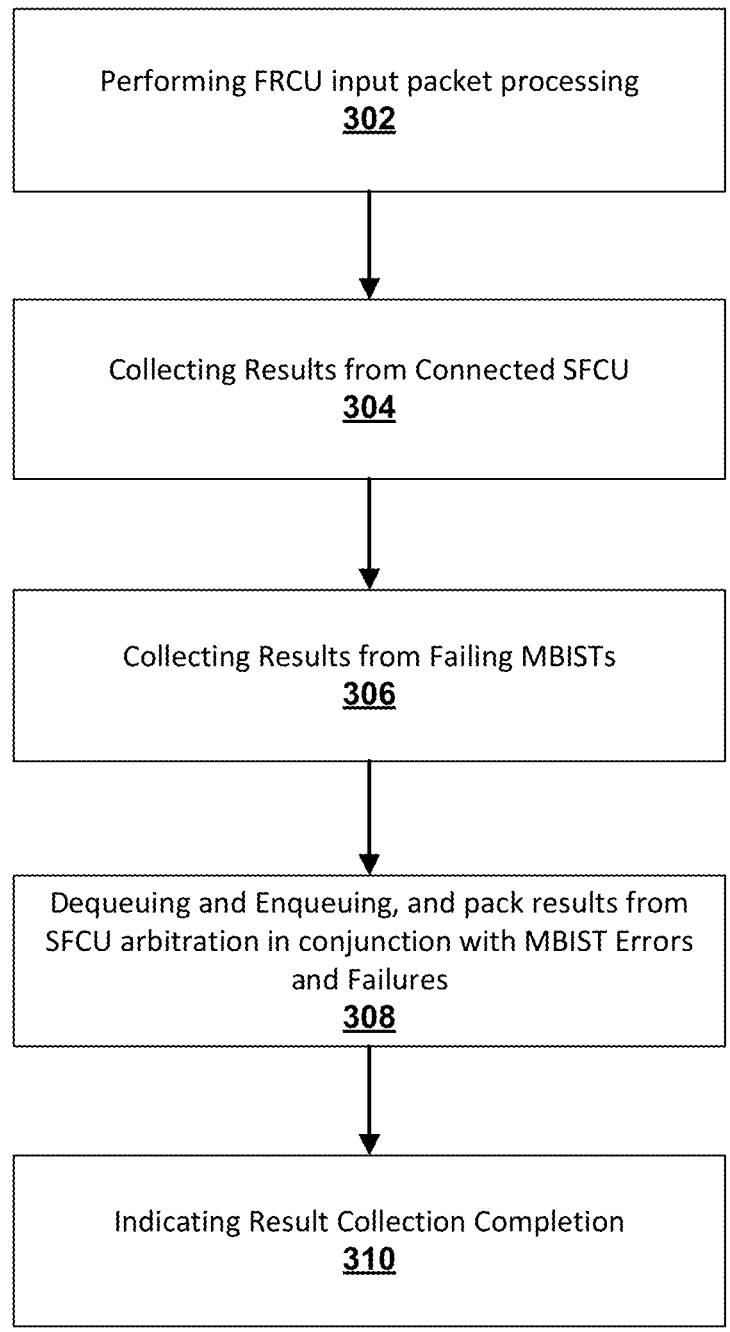
FIG. 3 is a flow diagram of a method for centrally logging and aggregating miscompares on chip during a memory test, according to some embodiments.

FIG. 3 is a flow diagram of a method for centrally logging and aggregating miscompares on chip during a memory test, according to some embodiments. Although the operations are depicted in FIG. 3 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the method 300 may be performed by processing logic that comprises hardware (e.g., circuitry, dedicated logic, programmable logic, microcode, etc.), firmware, or a combination thereof. In some embodiments, some or all operations of method 300 may be performed by one or more components (e.g., the BIST unit) of the memory device 104 in FIG. 1.

The method 300, in some embodiments, includes the operation 302 of performing FRCU input packet processing. In some embodiments, the operation 302 may include generating a wait for input packet indicating BIST Run completion and/or result collection can commence.

The method 300, in some embodiments, includes the operation 304 of collecting results from a connected SFCU.

The method 300, in some embodiments, includes the operation 306 of collecting results from failing MBISTs. In some embodiments, the operation 306 may include counting the number of MBISTs in fault. In some embodiments, the operation 306 may include counting the number of MBISTs where built-in redundancy analysis (BIRA) encountered correctable errors.

The method 300, in some embodiments, includes the operation 308 of dequeuing and enqueuing, and pack results from SFCU arbitration in conjunction with MBIST errors and failures.

The method 300, in some embodiments, includes the operation 310 of indicating results collection completion. In some embodiments, the operation 310 may include allowing for access to the ATE 102. In some embodiments, the operation 310 may include allowing for system access.

Figure 4:
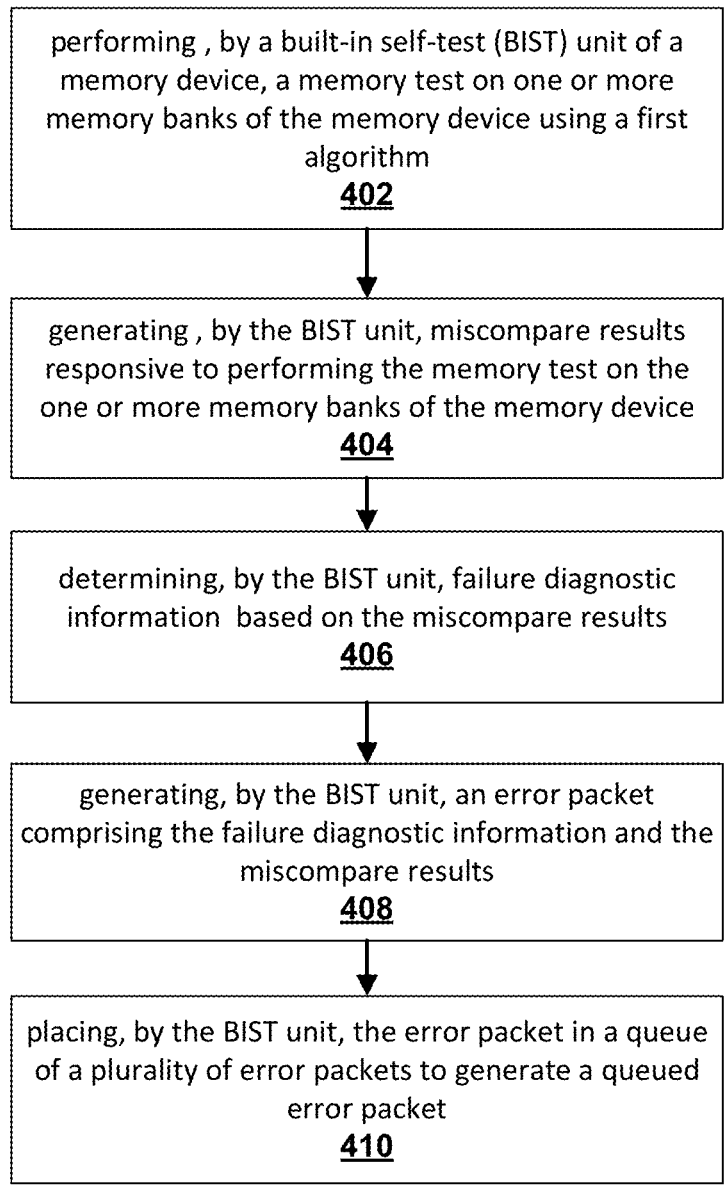
FIG. 4 is a flow diagram of a method for centrally logging and aggregating miscompares on chip during a memory test, according to some embodiments.

FIG. 4 is a flow diagram of a method for centrally logging and aggregating miscompares on chip during a memory test, according to some embodiments. Although the operations are depicted in FIG. 4 as integral operations in a particular order for purposes of illustration, in other implementations, one or more operations, or portions thereof, are performed in a different order, or overlapping in time, in series or parallel, or are omitted, or one or more additional operations are added, or the method is changed in some combination of ways. In some embodiments, the method 400 may be performed by processing logic that comprises hardware (e.g., circuitry, dedicated logic, programmable logic, microcode, etc.), firmware, or a combination thereof. In some embodiments, some or all operations of method 400 may be performed by one or more components (e.g., the BIST unit) of the memory device 104 in FIG. 1.

The method 400, in some embodiments, includes the operation 402 of performing, by a built-in self-test (BIST) unit of a memory device, a memory test on one or more memory banks of the memory device using a first algorithm.

The method 400, in some embodiments, includes the operation 404 of generating, by the BIST unit, miscompare results responsive to performing the memory test on the one or more memory banks of the memory device.

The method 400, in some embodiments, includes the operation 406 of determining, by the BIST unit, failure diagnostic information based on the miscompare results.

The method 400, in some embodiments, includes the operation 408 of generating, by the BIST unit, an error packet comprising the failure diagnostic information and the miscompare results.

The method 400, in some embodiments, includes the operation 410 of placing, by the BIST unit, the error packet in a queue of a plurality of error packets to generate a queued error packet.

In the above description, some portions of the detailed description are presented in terms of algorithms and symbolic representations of operations on analog signals and/or digital signals or data bits within a non-transitory storage medium. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "performing," "generating," "determining," "placing," or the like, refer to the actions and processes of an integrated circuit (IC) controller, or similar electronic device, that manipulates and transforms data represented as physical (e.g., electronic) quantities within the controller's registers and memories into other data similarly represented as physical quantities within the controller memories or registers or other such information non-transitory storage medium.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments described herein may also relate to an apparatus (e.g., such as an AC-DC converter, and/or an ESD protection system/circuit) for performing the operations herein. This apparatus may be specially constructed for the required purposes, or it may comprise firmware or hardware logic selectively activated or reconfigured by the apparatus. Such firmware may be stored in a non-transitory computer-readable storage medium, such as, but not limited to, read-only memories (ROMs), random access memories (RAMs), EPROMs, EEPROMs, flash memory, or any type of media suitable for storing electronic instructions. The term "computer-readable storage medium" should be taken to include a single medium or multiple media that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
   performing, by a built-in self-test (BIST) unit of a memory device, a memory test on one or more memory banks of the memory device using a first algorithm;
   generating, by the BIST unit, miscompare results responsive to performing the memory test on the one or more memory banks of the memory device;
   determining, by the BIST unit, failure diagnostic information based on the miscompare results;
   generating, by the BIST unit, an error packet comprising the failure diagnostic information and the miscompare results;
   determining, by the BIST unit, that the first algorithm was used to perform the memory test associated with the error packet;
   tagging, by the BIST unit, the error packet with an identifier to the first algorithm to generate a tagged error packet; and
   placing, by the BIST unit, the tagged error packet in a queue of a plurality of error packets to generate a queued error packet.

2. The method of claim 1, where the failure diagnostic information comprises at least one of a memory bank identifier, an memory address identifier, or a failed bit position identifier.

3. The method of claim 1, wherein performing the memory test on the one or more memory banks of the memory device based on the first algorithm comprises:
   acquiring, by the BIST unit, memory data from a memory address of the one or more memory banks;
   calculating, by the BIST unit, reference data associated with the memory address of the one or more memory banks; and
   comparing, by the BIST unit, the memory data and the reference data to determine whether the memory data matches the reference data or the memory data mismatches the reference data.

4. The method of claim 3, further comprising:
   determining, by the BIST unit, a match between the memory data and the reference data; and
   preventing, by the BIST unit, a packet from being generated based on the match.

5. The method of claim 3, further comprising:
   determining, by the BIST unit, a mismatch between the memory data and the reference data; and
   generating, by the BIST unit, the miscompare result responsive to determining the mismatch between the memory data and the reference data.

6. The method of claim 3, wherein comparing the memory data and the reference data to determine whether the memory data matches the reference data or the memory data mismatches the reference data comprises:
   performing, by the BIST unit, an exclusive OR (XOR) operation using the memory data and the reference data.

7. The method of claim 1, further comprising:
   determining, by the BIST unit, an absence of an association between the miscompare results and each of the plurality of error packets in the queue; and
   generating, by the BIST unit, a flag indicating the absence of an association between the miscompare results and each of the plurality of error packets in the queue.

8. The method of claim 7, further comprising:
   detecting, by the BIST unit, the flag, and
   placing, by the BIST unit, the tagged error packet in the queue of the plurality of error packets to generate the queued error packet is responsive to detecting the flag.

9. The method of claim 1, further comprising:
   detecting, by the BIST unit, a presence of the error packet in the queue of the plurality of error packets; and removing, by the BIST unit responsive to detecting the presence of the error packet in the queue of the plurality of error packets, the error packet from the queue of the plurality of error packets to generate a de-queued error packet.

10. The method of claim 1, further comprising:
receiving, by the BIST unit from a testing equipment, a request to perform the memory test on the one or more memory banks of the memory device; and
sending, by the BIST unit to the testing equipment, the tagged error packet.

11. The method of claim 1, further comprising:
performing, by the BIST unit responsive to sending the tagged error packet to the testing equipment, a memory test on the one or more memory banks of the memory device using a second algorithm, wherein the first algorithm is different from the second algorithm.

12. A memory device, comprising:
one or more memory banks; and
a built-in self-test (BIST) unit configured to:
    perform a memory test on the one or more memory banks of the memory device using a first algorithm;
    generate miscompare results responsive to performing the memory test on the one or more memory banks of the memory device;
    determine failure diagnostic information based on the miscompare results;
    generate an error packet comprising the failure diagnostic information and the miscompare results;
    determine that the first algorithm was used to perform the memory test associated with the error packet;
    tag the error packet with an identifier to the first algorithm to generate a tagged error packet; and
    place the tagged error packet in a queue of a plurality of error packets to generate a queued error packet.

13. The memory device of claim 12, where the failure diagnostic information comprises at least one of a memory bank identifier, a memory address identifier, or a failed bit position identifier.

14. The memory device of claim 12, wherein the BIST unit further configured to:
acquire memory data from a memory address of the one or more memory banks;
calculate reference data associated with the memory address of the one or more memory banks; and
compare the memory data and the reference data to determine whether the memory data matches the reference data or the memory data mismatches the reference data.

15. The memory device of claim 14, wherein the BIST unit further configured to:
determine a match between the memory data and the reference data;
prevent a packet from being generated based on the match;
determine a mismatch between the memory data and the reference data; and
generate the miscompare result responsive to determining the mismatch between the memory data and the reference data.

16. The memory device of claim 14, wherein the BIST unit further configured to:
perform an exclusive OR (XOR) operation using the memory data and the reference data.

17. The memory device of claim 12, wherein the BIST unit further configured to:
determine an absence of an association between the miscompare results and each of the plurality of error packets in the queue;
generate a flag indicating the absence of an association between the miscompare results and each of the plurality of error packets in the queue;
detect the flag, and
place the tagged error packet in the queue of the plurality of error packets to generate the queued error packet is responsive to detecting the flag.

18. The memory device of claim 1, further comprising:
detect a presence of the error packet in the queue of the plurality of error packets;
remove, responsive to detecting the presence of the error packet in the queue of the plurality of error packets, the error packet from the queue of the plurality of error packets to generate a de-queued error packet.

19. A memory device, comprising:
a plurality of memory banks;
a plurality of comparators, each coupled to a respective memory bank of the plurality of memory banks;
a plurality of error capture units, each coupled to a respective comparator of the plurality of comparators; and
a queue coupled to the plurality of error capture units, wherein the queue configured to store one or more error packets associated with the plurality of memory banks;
wherein each comparator configured to:
    perform a memory test on the respective memory bank to generate a respective set of comparison results; and
    send the respective set of comparison results to the respective error capture unit;
wherein each error capture unit configured to:
    determine a respective set of failure diagnostic information based on the respective set of comparison results;
    generate a respective error packet comprising the respective set of failure diagnostic information and the respective set of comparison results;
    determine that the first algorithm was used to perform the memory test associated with the respective error packet;
    tag the respective error packet with an identifier to the first algorithm to generate a tagged error packet; and
    place the tagged error packet in the queue.

* * * * *